US012672510B2

(12) United States Patent
Tomida

(10) Patent No.: US 12,672,510 B2
(45) Date of Patent: Jun. 30, 2026

(54) TRANSPORT FACILITY

(71) Applicant: Daifuku Co., Ltd., Osaka (JP)

(72) Inventor: Daichi Tomida, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 216 days.

(21) Appl. No.: 18/769,758

(22) Filed: Jul. 11, 2024

(65) Prior Publication Data

US 2025/0022734 A1     Jan. 16, 2025

(30) Foreign Application Priority Data

Jul. 12, 2023     (JP) ................................. 2023-114603

(51) Int. Cl.
H10P 72/30          (2026.01)
B66C 1/30          (2006.01)
B66C 19/00          (2006.01)

(52) U.S. Cl.
CPC ............ H10P 72/3202 (2026.01); B66C 1/30 (2013.01); B66C 19/00 (2013.01); H10P 72/3221 (2026.01)

(58) Field of Classification Search
USPC ...................................................... 414/751.1
See application file for complete search history.

(56) References Cited

U.S. PATENT DOCUMENTS

| | | | |
|---|---|---|---|
| 4,427,431 A * | 1/1984 | Mumford .................. | C03B 9/40 |
| | | | 700/158 |
| 6,592,324 B2 * | 7/2003 | Downs ................ | B25J 17/0208 |
| | | | 414/730 |
| 7,887,108 B1 * | 2/2011 | Cawley .................. | B25J 15/022 |
| | | | 414/731 |
| 9,284,164 B2 * | 3/2016 | Fujiwara ................ | B66C 19/00 |
| 9,969,551 B2 * | 5/2018 | Abe ...................... | B65G 1/0407 |
| 11,261,026 B2 * | 3/2022 | Cavelius ................ | B65G 57/02 |
| 12,576,531 B1 * | 3/2026 | Zhang .................... | B25J 9/1682 |
| 2007/0140817 A1 * | 6/2007 | Hansl ........................ | B66F 9/07 |
| | | | 414/277 |
| 2009/0161480 A1 * | 6/2009 | Voss .................... | B01F 27/2721 |
| | | | 366/132 |
| 2012/0000875 A1 * | 1/2012 | Kawabata ................ | B66C 1/28 |
| | | | 294/207 |

(Continued)

FOREIGN PATENT DOCUMENTS

| | | |
|---|---|---|
| JP | 201694263 A | 5/2016 |

*Primary Examiner* — Jonathan L Sample
(74) *Attorney, Agent, or Firm* — The Webb Law Firm

(57)          ABSTRACT

A transport facility includes a container mount that supports a container, and a transport vehicle that transports the container. The transport vehicle includes a holder that holds and releases the container, and a lifter that lifts and lowers the holder. The holder includes a first support and a second support that are pair of supports, a holder driver that causes the pair of supports to change a posture between a holding posture for holding the container and a releasing posture for releasing the container, a first engagement portion fixed to the first support, and a second engagement portion fixed to the second support. The container mount includes a container positioner that positions the container, a first engagement receiver, and a second engagement receiver. At least one of the holder or the container mount includes a first guide portion, and a second guide portion.

6 Claims, 10 Drawing Sheets

(56) References Cited

U.S. PATENT DOCUMENTS

| | | | |
|---|---|---|---|
| 2015/0197412 A1* | 7/2015 | Tomida | B66C 13/18 |
| | | | 212/328 |
| 2015/0336280 A1* | 11/2015 | Usami | B25J 15/10 |
| | | | 294/67.33 |
| 2016/0130083 A1* | 5/2016 | Abe | B65G 1/0407 |
| | | | 414/276 |
| 2016/0133488 A1* | 5/2016 | Tomida | H10P 72/3218 |
| | | | 212/71 |
| 2022/0185585 A1* | 6/2022 | Toebes | B25J 5/007 |

* cited by examiner

TRANSPORT FACILITY

CROSS-REFERENCE TO RELATED APPLICATION

This application claims priority to Japanese Patent Application No. 2023-114603 filed Jul. 12, 2023, the disclosure of which is hereby incorporated by reference in its entirety.

BACKGROUND OF THE INVENTION

Field of the Invention

The present invention relates to a transport facility including a container mount that supports a container and a transport vehicle that transports the container and includes a holder for holding and releasing the container and a lifter for lifting and lowering the holder.

Description of Related Art

Japanese Unexamined Patent Application Publication No. 2016-94263 (Patent Literature 1) describes, for example, a technique for a transport facility. Reference signs in parentheses used below in describing the background are the reference signs in Patent Literature 1.

The transport facility described in Patent Literature 1 includes a container mount (mount 4) supporting a container (transported article 6) and a transport vehicle (ceiling-hung transport vehicle 1) for transporting the container. The transport vehicle includes a holder (support assembly 23) for holding a container and a lifter (lifting operation assembly 24) for lifting and lowering the holder. In this transport facility, the container is transferred between the transport vehicle and the container mount by the holder being lifted and lowered between a transport position at which the transport vehicle transports the container and a transfer position corresponding to the container mounted on the container mount below the transport position.

In the transport facility described in Patent Literature 1, the holder includes a pair of supports that support a supportable portion of a container. The pair of supports move toward and away from each other to change between a posture in which the pair of supports can support the supportable portion from below and a posture in which the pair of supports release the supportable portion. The holder holds the container by supporting the supportable portion of the container with the pair of supports. The container mount may include a positioner for positioning the container. When the pair of supports support the supportable portion not appropriately, the container may not be transferred to the container mount appropriately.

SUMMARY OF THE INVENTION

One or more aspects are directed to a transport facility that can appropriately transfer a container between a container mount and a transport vehicle.

A transport facility according to an aspect of the disclosure includes a container mount that supports a container, and a transport vehicle that transports the container. The transport vehicle includes a holder that holds and releases the container, and a lifter that lifts and lowers the holder. The holder includes a first support and a second support being a pair of supports that support a supportable portion of the container, a holder driver that moves the pair of supports toward and away from each other to change a posture of the pair of supports between a holding posture for holding the container and a releasing posture for releasing the container, a first engagement portion fixed to the first support, and a second engagement portion fixed to the second support. The container mount includes a container positioner that positions the container, a first engagement receiver at a fixed position relative to the container positioner, and a second engagement receiver at a fixed position relative to the container positioner. The first engagement receiver is engageable with the first engagement portion to position the first engagement portion. The second engagement receiver is engageable with the second engagement portion to position the second engagement portion. At least one of the holder or the container mount includes a first guide portion and a second guide portion. The first guide portion guides the first engagement portion moving in response to a holding operation of the first support toward the first engagement receiver. The second guide portion guides the second engagement portion moving in response to the holding operation of the second support toward the second engagement receiver. The holding operation is an operation of the pair of supports to change the posture from the releasing posture to the holding posture.

In this structure, with the movement of the first engagement portion and the second engagement portion in response to the holding operation of the first support and the second support included in the holder, the first guide portion can guide the first engagement portion toward the first engagement receiver until the first engagement portion engages with the first engagement receiver, and the second guide portion can guide the second engagement portion toward the second engagement receiver until the second engagement portion engages with the second engagement receiver. This can position the first engagement portion and the second engagement portion appropriately, thus positioning the first support to which the first engagement portion is fixed and the second support to which the second engagement portion is fixed appropriately relative to the container positioned by the container positioner. Thus, the pair of supports can easily support the container appropriately. The lifter can lift and lower the holder that is holding the container appropriately.

In this manner, this structure can transfer the container between the container mount and the transport vehicle appropriately.

Further features and advantageous effects of the transport facility will be apparent from exemplary and nonlimiting embodiments described below with reference to the drawings.

DESCRIPTION OF THE INVENTION

Figure 1:
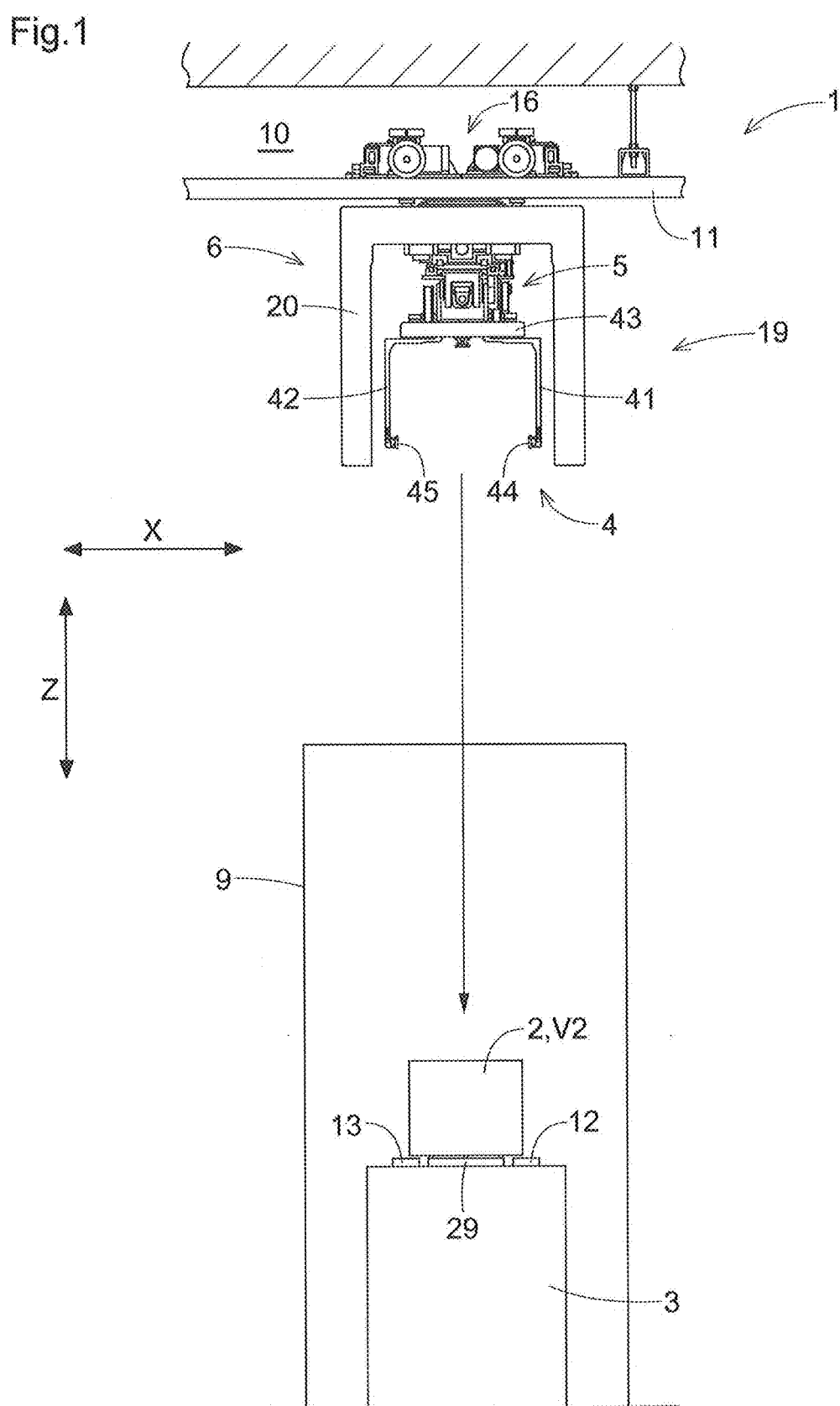
FIG. 1 is a side view of a transport facility.

A transport facility according to an embodiment will be described with reference to the drawings. As shown in FIG. 1, a transport facility 1 includes a container mount 3 that supports a container 2 and a transport vehicle 6 that transports the container 2.

In the present embodiment, the container mount 3 is included in a processing device 9. The processing device 9 processes an object contained in the container 2. The transport vehicle 6 travels along a travel path to transport the container 2 to a transfer area. Examples of the transfer area include a storage shelf (not shown) for storing containers 2 or the container mount 3 in the processing device 9.

Figure 2:
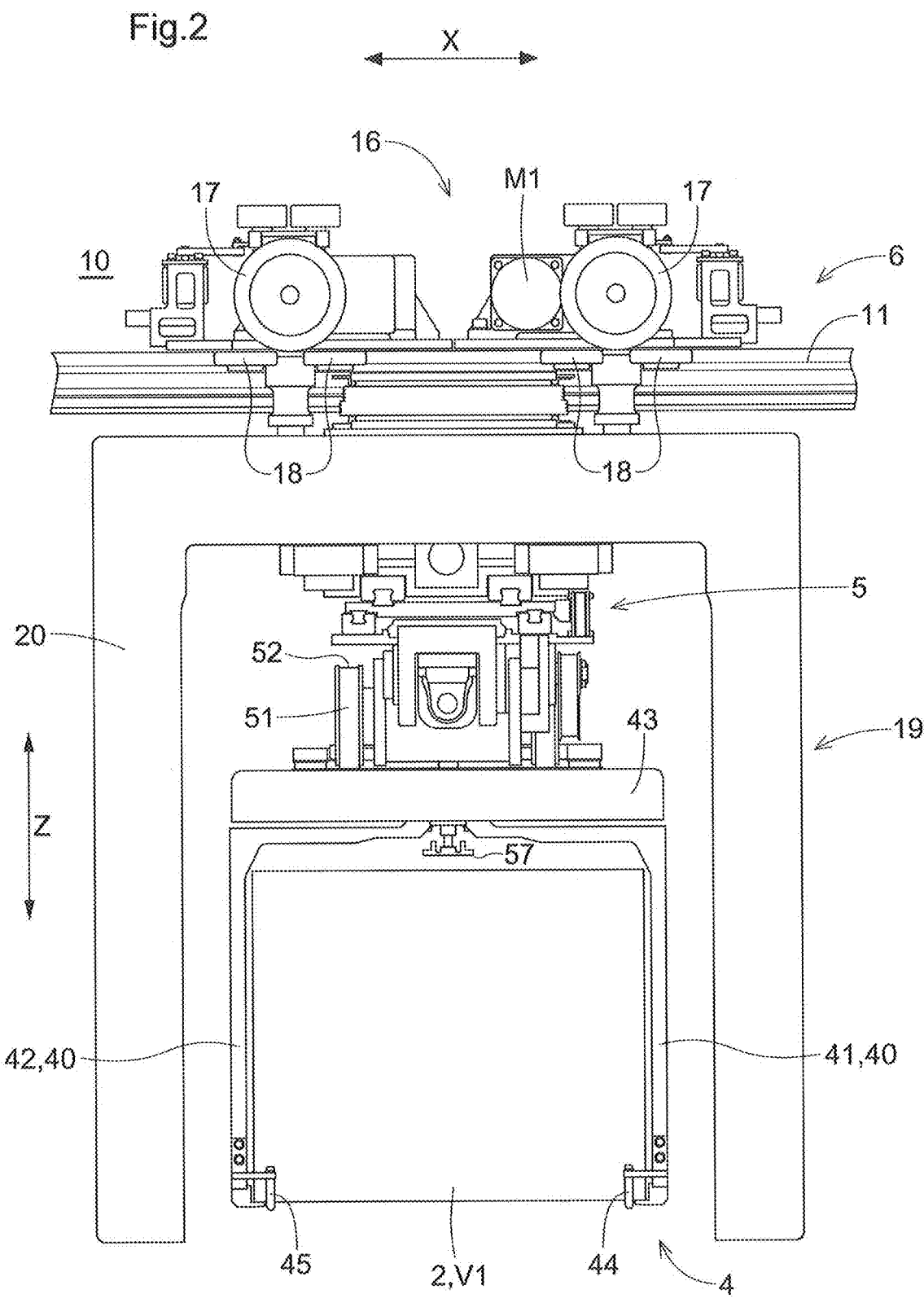
FIG. 2 is a side view of a transport vehicle.

As shown in FIGS. 1 and 2, the travel path for the transport vehicle 6 extends along the ceiling. Rails 11 extend along the travel path. In this example, the transport vehicle 6 travels while being guided along the rails 11 (a pair of rails 11 in this example) hung from the ceiling. The transport vehicle 6 is thus, but not limited to, a ceiling-hung transport vehicle.

In this example, the transport facility 1 includes multiple processing devices 9, one of which is shown in the example in FIG. 1. The transport vehicle 6 transports the container 2 between the multiple processing devices 9. Each of the processing devices 9 includes the container mount 3. The container mount 3 supports a container 2 transferred from the transport vehicle 6. The container mount 3 also supports a container 2 unloaded from the processing device 9. The transport vehicle 6 stops at a position corresponding to the container mount 3 (a position immediately above the container mount 3) on the travel path and transfers the container 2 to and from the container mount 3. In this example, the container 2 to be transported is, but not limited to, a container (front opening shipping box, or FOSB) that contains semiconductor substrates. The container 2 may be, for example, a front opening unified pod (FOUP) or a reticle container (reticle pod) that contains reticles. The processing device 9 processes a semiconductor substrate stored in the container 2. Although the container mount 3 includes a transport device for loading and unloading the container 2 to and from the internal space of the processing device 9, the transport device will not be described. The container mount 3 described below may be included in a storage shelf for storing containers 2. In this case, the storage shelf may be disposed on the floor surface or hung from the ceiling. The container mount 3 may not include the transport device described above.

As shown in FIGS. 1 and 2, the transport vehicle 6 includes a holder 4 that holds and releases the container 2 and a lifter 5 that lifts and lowers the holder 4. In the present embodiment, the transport vehicle 6 further includes a traveler 16, a body 19 connected to the traveler 16 and for accommodating the container 2, and a controller H. The holder 4 and the lifter 5 are disposed on the body 19.

As shown in FIG. 2, the traveler 16 includes wheels 17 that roll on the rails 11 and a travel motor M1. In this example, the travel motor M1 drives at least one of the wheels 17 and provides a propelling force for the transport vehicle 6 guided along the pair of rails 11 to move. The traveler 16 supports the body 19 below the traveler 16 with the rails 11 between the traveler 16 and the body 19.

As shown in FIG. 1, the lifter 5 lifts and lowers the container 2 held by the holder 4 between an accommodated position V1 and a lowered position V2 that is below the accommodated position V1. The lifter 5 lifts the container 2 held by the holder 4 from the lowered position V2 to the accommodated position V1 when the transport vehicle 6 travels. The lifter 5 lowers the container 2 held by the holder 4 from the accommodated position V1 to the lowered position V2 when the container 2 is transferred from the transport vehicle 6 to the container mount 3. The accommodated position V1 is a position at which the body 19 accommodates the container 2. In the examples in FIGS. 1 and 2, the body 19 includes a cover 20. The cover 20 covers outer surfaces of the body 19 that face in the travel direction of the transport vehicle 6. The container 2 is accommodated in an accommodating space that is below the body 19 and covered with the cover 20. At the accommodated position V1, the container 2 is accommodated in the accommodating space covered with the cover 20. The lowered position V2 is a position at which the container 2 is supported by the container mount 3. In the example in FIG. 1, the lowered position V2 is a position at which the container 2 is mounted on a predetermined area on the container mount 3 included in the processing device 9. The structure of the container mount 3 will be described in detail later. The cover 20 may be eliminated.

In this example, the holder 4 rises and lowers as the container 2 rises and lowers. In the example in FIG. 2, the lifter 5 includes a winder 51 supported by the body 19, a belt 52 that is wound by the winder 51 and is connected to the holder 4 at its distal end, and a lift motor (not shown) that rotates the winder 51 to drive the belt 52. The lifter 5 lifts and lowers the holder 4 and the container 2 held by the holder 4 relative to the body 19 by driving the lift motor to rotate the winder 51 to wind and unwind the belt 52.

As shown in FIGS. 1 to 4, the holder 4 includes a first support 41 and a second support 42 included in a pair of supports 40 that support supportable portions 21 of the container 2, a holder driver 43 that changes the posture of the pair of supports 40, a first engagement portion 44 fixed to the first support 41, and a second engagement portion 45 fixed to the second support 42. Hereafter, the direction in which the pair of supports 40 move toward and away from each other is referred to as a first direction X, and the direction perpendicular to the first direction X as viewed in a vertical direction Z is referred to as a second direction Y. For each support 40 of the pair, the side on which the support 40 in a releasing posture T2 is disposed relative to the support 40 in a holding posture T1 is referred to as a releasing side X2 in the first direction. The side opposite to the releasing side X2 in the first direction is referred to as a holding side X1 in the first direction. A first side in the second direction Y is referred to as a first side Y1 in the second direction. A second side opposite to the first side Y1 in the second direction Y is referred to as a second side Y2 in the second direction. The first direction X and the second direction Y are parallel to a horizontal plane. The first direction X is the same direction as the travel direction of the transport vehicle 6. In the present embodiment, the first support 41 and the second support 42 are spaced from each other in the first direction X with the container 2 at the accommodated position V1 between them.

Figure 3:
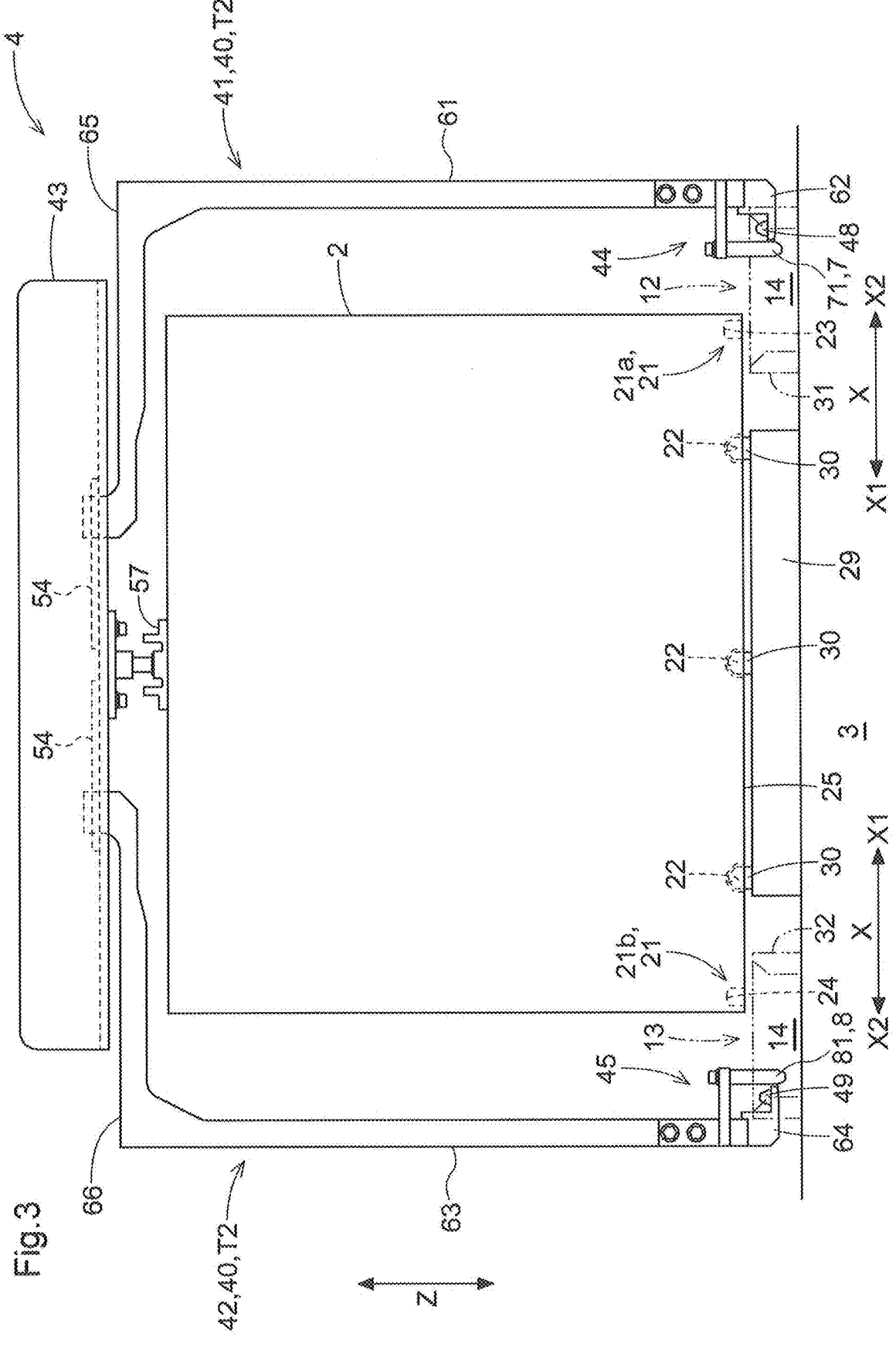
FIG. 3 is a schematic side view of a holder, a container mount, and a container.
Figure 4:
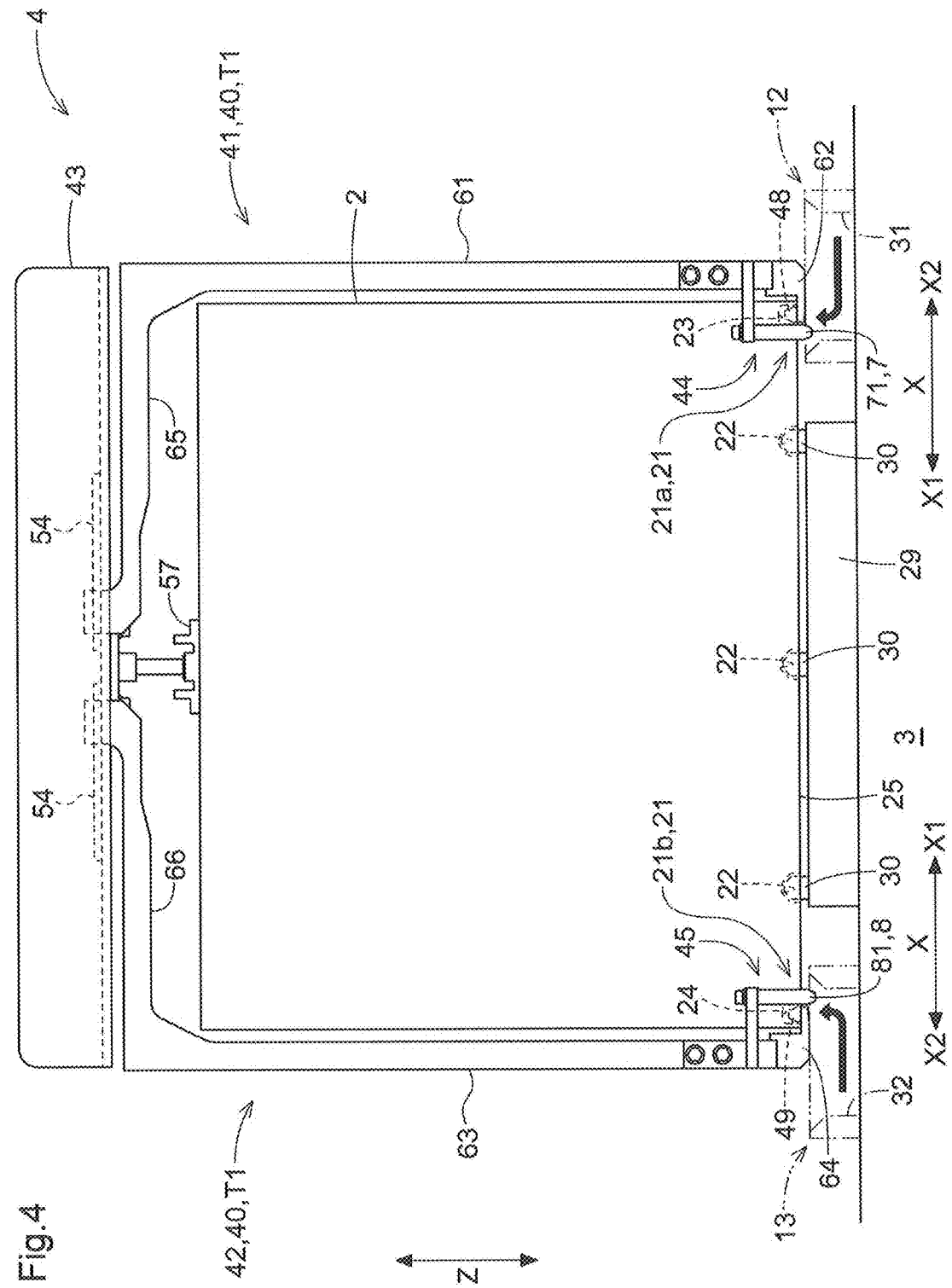
FIG. 4 is a schematic side view of the holder, the container mount, and the container.

As shown in FIGS. 3 and 4, the holder driver 43 moves the pair of supports 40 (the first support 41 and the second support 42) toward and away from each other to change the posture of the pair of supports 40 between the holding posture T1 for holding the container 2 and the releasing posture T2 for releasing the container 2. In the present embodiment, the holder driver 43 moves the pair of supports 40 toward each other to change the posture of the pair of supports 40 from the releasing posture T2 to the holding posture T1. The holder driver 43 moves the pair of supports 40 away from each other to change the posture of the pair of supports 40 from the holding posture T1 to the releasing posture T2. In this example, the holder driver 43 includes a drive motor (not shown) and a linear guide assembly 54 that guides each support 40 of the pair in the first direction X. The linear guide assembly 54 (a linear rail in this example) supports the pair of supports 40. The pair of supports 40 are connected to the drive motor with ball screws (not shown). When the drive motor drives the ball screws to rotate, the pair of supports 40 move in the first direction X while being guided by the linear guide assembly 54. In this manner, the pair of supports 40 move toward and away from each other in the first direction X to change the posture between the holding posture T1 and the releasing posture T2. To transfer the container 2 transported by the transport vehicle 6 to the container mount 3, the container 2 is lowered from the accommodated position V1 to the lowered position V2 with the pair of supports 40 remaining in the holding posture T1. The pair of supports 40 then change the posture from the holding posture T1 to the releasing posture T2. The container 2 is thus supported on the container mount 3. To transfer the container 2 supported on the container mount 3 to the transport vehicle 6, the pair of supports 40 change the posture from the releasing posture T2 to the holding posture T1 before lifting the container 2 from the lowered position V2. The container 2 is thus supported by the pair of supports 40. The container 2 is continuously lifted to the accommodated position V1, and the transport vehicle 6 transports the container 2 to the next destination. Such control is described in detail later.

As shown in FIGS. 1 to 4, the first support 41 includes a first arm 61 and a first support plate 62. The second support 42 includes, similarly to the first support 41, a second arm 63 and a second support plate 64. In this example, the first support 41 and the second support 42 have the same structure. The structure of the first support 41 will be described in detail below, and the structure of the second support 42 may not be described.

Figure 5:
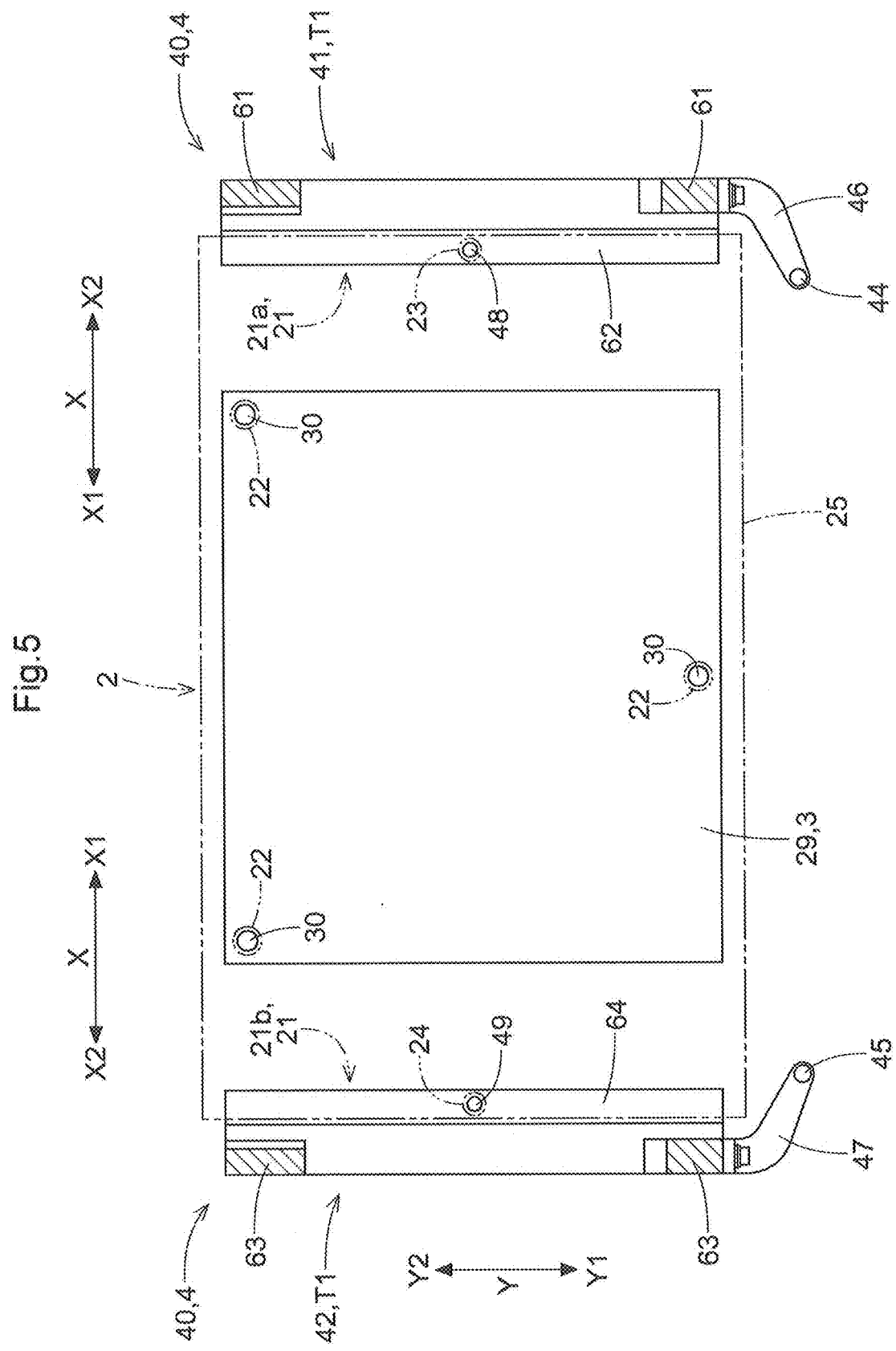
FIG. 5 is a schematic plan view of a pair of supports and a supportable portion.

As shown in FIGS. 2, 3, and 4, the first arm 61 is in the form of a plate extending in the vertical direction Z and in the second direction Y. The first arm 61 has its upper end connected to the linear guide assembly 54. In the illustrated example, the first arm 61 is connected to the linear guide assembly 54 with a first connecting member 65 between them. The first arm 61 has its lower end connected to the first support plate 62. As shown in FIG. 5, the first support plate 62 is in the form of a plate extending in the first direction X and in the second direction Y. In this example, the first arm 61 overlaps a side surface (a surface facing in the first direction X) of the container 2 at the accommodated position V1 as viewed in the first direction X. The lower end of the first arm 61 is disposed below the corresponding supportable portion 21 of the container 2 at the accommodated position V1. The first support plate 62 protrudes inward in the first direction X (or toward the container 2 at the accommodated position V1) from the lower end of the first arm 61 and overlaps the corresponding supportable portion 21 of the container 2 as viewed in the vertical direction Z.

In this example, the supportable portions 21 of the container 2 correspond to a bottom 25 of the container 2. More specifically, the supportable portions 21 are opposite ends of the bottom 25 in the first direction X. For the container 2 supported by the pair of supports 40, the supportable portions 21 are the entire area overlapping the first support plate 62 and the entire area overlapping the second support plate 64 as viewed in the vertical direction Z. The supportable portion 21 overlapping the first support plate 62 as viewed in the vertical direction Z is referred to as a first supportable portion 21a, and the supportable portion 21 overlapping the second support plate 64 as viewed in the vertical direction Z is referred to as a second supportable portion 21b. The supportable portions 21 may have different shapes as appropriate. For example, the supportable portions 21 may be recessed upward from the bottom surface of a portion of the bottom 25 other than the supportable portions 21, or may be members each in the form of a plate protruding outward in the first direction X from the body of the container 2 containing an object.

In the illustrated example, the supportable portions 21 are simply flat, similarly to the bottom surface of the portion of the bottom 25 other than the supportable portions 21. In the present embodiment, a third engagement receiver 23 and a fourth engagement receiver 24 are disposed in the supportable portions 21 of the container 2 as shown in FIGS. 3 to 5. The third engagement receiver 23 is disposed in the first supportable portion 21a. The fourth engagement receiver 24 is disposed in the second supportable portion 21b. In the illustrated example, the third engagement receiver 23 and the fourth engagement receiver 24 are insertion holes recessed upward in the supportable portions 21. In the example in FIG. 5, each insertion hole is in the middle in the second direction Y of the first supportable portion 21a or the second supportable portion 21b. Although the container 2 in the illustrated example includes no flange protruding upward from the body of the container 2, the transport facility 1 according to the present embodiment may use a container 2 with a flange.

As shown in FIGS. 3 to 5, the first support 41 includes a third engagement portion 48 engageable with the third engagement receiver 23 in the corresponding supportable portion 21 of the container 2. The second support 42 includes a fourth engagement portion 49 engageable with the fourth engagement receiver 24 in the corresponding supportable portion 21 of the container 2. The third engagement portion 48 is disposed on the first support plate 62 in the first support 41. The fourth engagement portion 49 is disposed on the second support plate 64 in the second support 42. The third engagement portion 48 is a pin protruding upward from the first support plate 62. Similarly, the fourth engagement portion 49 is a pin protruding upward from the second support plate 64. In the illustrated example, the third engagement portion 48 engages with the third engagement receiver 23 when the pin as the third engagement portion 48 is placed in the insertion hole as the third engagement receiver 23, and the fourth engagement portion 49 engages with the fourth engagement receiver 24 when the pin as the fourth engagement portion 49 is placed in the insertion hole as the fourth engagement receiver 24. In the example in FIG. 5, the third engagement portion 48 is in the middle in the second direction Y of the first support plate 62, and the fourth engagement portion 49 is in the middle in the second direction Y of the second support plate 64.

As shown in FIGS. 1 to 5, each of the first engagement portion 44 and the second engagement portion 45 is in the form of a protrusion protruding downward. The first engagement portion 44 is supported by the first arm 61 of the first support 41 with a first holding member 46 between them. The second engagement portion 45 is supported by the second arm 63 of the second support 42 with a second holding member 47 between them. In the present embodiment, as shown in FIG. 5, the first engagement portion 44 and the second engagement portion 45 are arranged inward in the first direction X from the outer edges of the pair of supports 40 in the first direction X. The first engagement portion 44 and the second engagement portion 45 are arranged outward on the first side Y1 in the second direction from the edges of the pair of supports 40 on the first side Y1 in the second direction. In this example, the first engagement portion 44 is disposed, relative to the first arm 61 and the first support plate 62, on the holding side X1 in the first direction and on the first side Y1 in the second direction. The second engagement portion 45 is disposed, relative to the second arm 63 and the second support plate 64, on the holding side X1 in the first direction and on the first side Y1 in the second direction. Thus, the first holding member 46 and the second holding member 47 protrude inward in the first direction X (on the holding side X1 in the first direction) and toward the first side Y1 in the second direction relative to the pair of supports 40 (FIG. 5).

Figure 6:
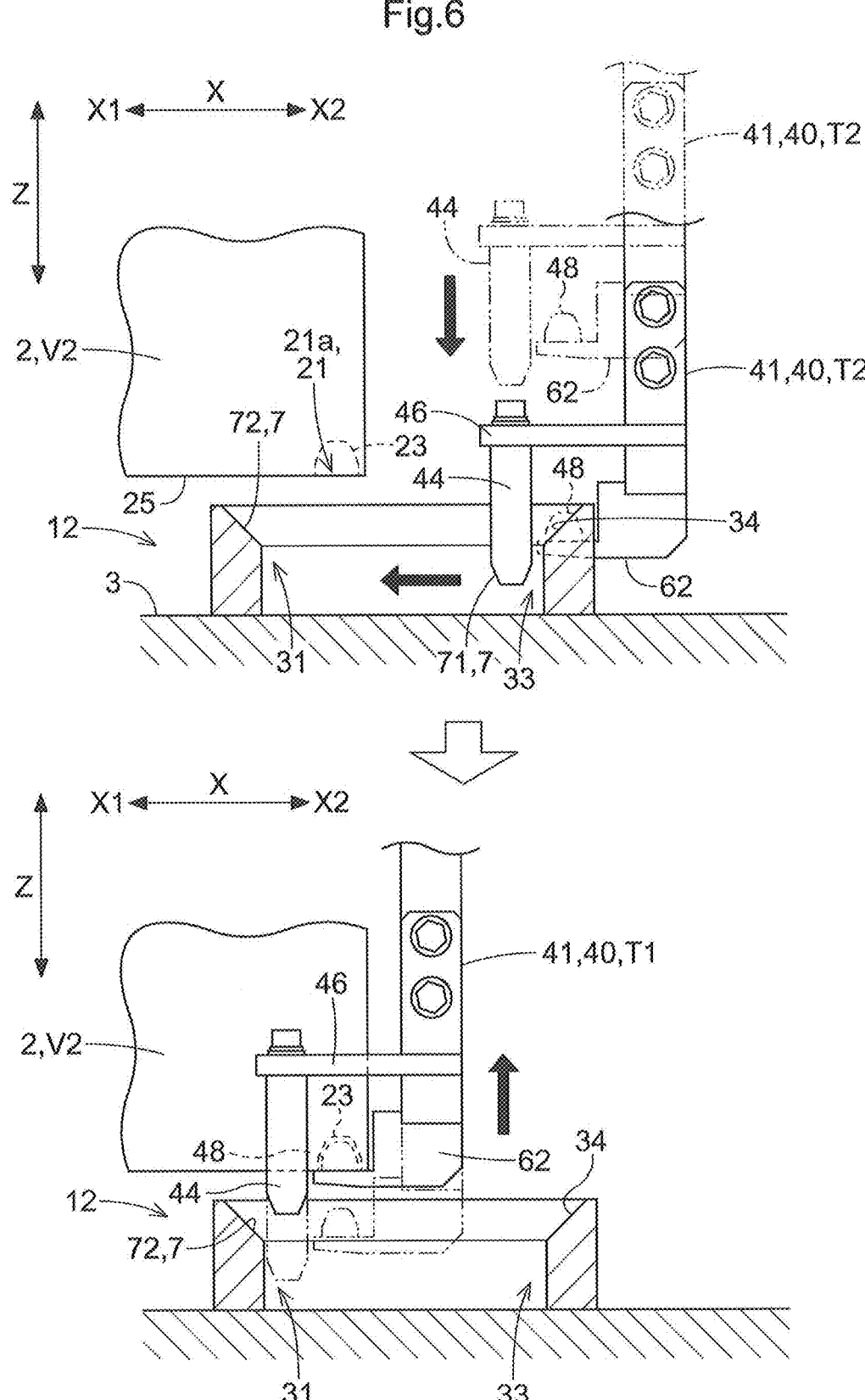
FIG. 6 is a schematic side view of a first engagement portion engaged with a first engagement receiver.

As described above, the first engagement portion 44 is fixed to the first support 41. The first engagement portion 44 thus moves integrally with the first support 41 in the first direction X. The second engagement portion 45 is fixed to the second support 42. The second engagement portion 45 thus moves integrally with the second support 42 in the first direction X. In the present embodiment, the first engagement portion 44 and the second engagement portion 45 have the same structure. The first engagement portion 44 is in the form of a rod elongated in the vertical direction Z. As shown in FIGS. 2 to 4, and 6, the first engagement portion 44 supported by the first arm 61 has its lower end below the first support plate 62. Similarly, the second engagement portion 45 is in the form of a rod elongated in the vertical direction Z. The second engagement portion 45 supported by the second arm 63 has its lower end below the second support plate 64. In the present embodiment, as shown in FIG. 6, the first engagement portion 44 has its lower portion entirely tapered in the circumferential direction and has a smaller horizontal dimension downward. The first engagement portion 44 thus has a first engagement guide surface 71 entirely tapered in the circumferential direction. The second engagement portion 45 has its lower portion entirely tapered in the circumferential direction and has a smaller horizontal dimension downward. The second engagement portion 45 thus has a second engagement guide surface 81 entirely tapered in the circumferential direction (FIGS. 3 and 4). In the example shown in FIGS. 2 to 4, the holder 4 includes a press 57. The press 57 is disposed below the holder driver 43 and between the pair of supports 40. The press 57 is in contact with the upper surface of the container 2 supported by the pair of supports 40. The press 57 can stably support the container 2 held by the holder 4.

As shown in FIGS. 3 to 6, the container mount 3 includes container positioners 30, a first engagement receiver 31, and a second engagement receiver 32. The container positioners 30 position the container 2. The first engagement receiver 31 is at a fixed position relative to the container positioners 30 and is engageable with the first engagement portion 44 to position the first engagement portion 44. The second engagement receiver 32 is at a fixed position relative to the container positioners 30 and is engageable with the second engagement portion 45 to position the second engagement portion 45. The first engagement receiver 31 and the second engagement receiver 32 arranged on the container mount 3 correspond to the first engagement portion 44 and the second engagement portion 45 of the pair of supports 40 in the holding posture T1. More specifically, the first engagement receiver 31 and the second engagement receiver 32 are spaced from each other in the first direction X with the container positioners 30 between them. The first engagement receiver 31 and the second engagement receiver 32 are arranged on the first side Y1 in the second direction relative to the container positioners 30. The container positioners 30, the first engagement receiver 31, and the second engagement receiver 32 are arranged on the upper surface of the container mount 3. In this example, the container positioners 30 include multiple pins (e.g., kinematic pins) that position the container 2 mounted on the container mount 3. In the illustrated example, the container positioners 30 (in other words, the multiple pins) are arranged on a mount body 29 on the upper surface of the container mount 3. As shown in FIG. 5, the bottom 25 of the container 2 has multiple engagement holes 22 that are engageable with the respective pins. The container mount 3 (the mount body 29 in this example) supports the container 2 with the pins as the container positioners 30 engaging with the engagement holes 22.

As shown in FIGS. 6 to 9, each of the first engagement receiver 31 and the second engagement receiver 32 is in the form of a recess that is open upward. With the pair of supports 40 in the holding posture T1, the first engagement receiver 31 can engage with the first engagement portion 44 in the form of a protrusion and the second engagement receiver 32 can engage with the second engagement portion 45 in the form of a protrusion. More specifically, the first engagement receiver 31 receives and engages with the first engagement portion 44 placed from above, and the second engagement receiver 32 receives and engages with the second engagement portion 45 placed from above. The state of being engaged may be hereafter simply referred to as an engaged state. A state other than the engaged state may be simply referred to as a non-engaged state. In the present embodiment, the first engagement receiver 31 and the second engagement receiver 32 are also open on the releasing side X2 in the first direction. Thus, the first engagement receiver 31 and the second engagement receiver 32 in the engaged state can move toward the releasing side X2 in the first direction without any restriction. The first engagement receiver 31 and the second engagement receiver 32 in the engaged state can thus move toward the releasing side X2 in the first direction in response to the change in the posture of the pair of supports 40 from the holding posture T1 to the releasing posture T2. The first engagement receiver 31 and the second engagement receiver 32 in the non-engaged state can move toward the holding side X1 in the first direction in response to the change in the posture of the pair of supports 40 from the releasing posture T2 to the holding posture T1. The first engagement receiver 31 and the second engagement receiver 32 are not open on the holding side X1 in the first direction. Thus, after engaging with the first engagement receiver 31, the first engagement portion 44 is restricted from moving further toward the holding side X1 in the first direction. Similarly, after engaging with the second engagement receiver 32, the second engagement portion 45 is restricted from moving further toward the holding side X1 in the first direction. This positions the first engagement portion 44 and the second engagement portion 45 in the engaged state. In this example, the first engagement receiver 31 and the second engagement receiver 32 also restrict the first engagement portion 44 and the second engagement portion 45 from moving in the second direction Y.

As shown in FIGS. 1, 3, 4, and 6, the container mount 3 includes a first guide 12 and a second guide 13 in this example. The first engagement receiver 31 is in the first guide 12. The second engagement receiver 32 is in the second guide 13. The first guide 12 and the second guide 13 each have a groove 14 that is open upward. In this example, each groove 14 is simply open upward. The first guide 12 and the second guide 13 are arranged on the upper surface of the container mount 3 and are spaced from each other in the first direction X with the mount body 29 between them. In the illustrated example, the grooves 14 include the entire portion of paths along which the first engagement portion 44 or the second engagement portion 45 can move in the first direction X. The first engagement portion 44 or the second engagement portion 45 received in the corresponding groove 14 from above can thus move in the first direction X. In the example in FIG. 7, the first engagement receiver 31 is at the end of the groove 14 in the first guide 12 on the holding side X1 in the first direction.

The first engagement receiver 31 has a shape, as viewed in the vertical direction Z, corresponding to the shape (an arc in this example) of the first engagement portion 44 as viewed in the vertical direction Z. The first engagement receiver 31 has a size, as viewed in the vertical direction Z, corresponding to the size of the first engagement portion 44 as viewed in the vertical direction Z. In the example in FIG. 8, the second engagement receiver 32 is at the end of the groove 14 in the second guide 13 on the holding side X1 in the first direction. The second engagement receiver 32 has a shape, as viewed in the vertical direction Z, corresponding to the shape (an arc in this example) of the second engagement portion 45 as viewed in the vertical direction Z. The second engagement receiver 32 has a size, as viewed in the vertical direction Z, corresponding to the size of the second engagement portion 45 as viewed in the vertical direction Z. The first guide 12 and the second guide 13 have the same structure. Thus, the structure of the first guide 12 will be described in detail, and the structure of the second guide 13 may not be described.

Figure 7:
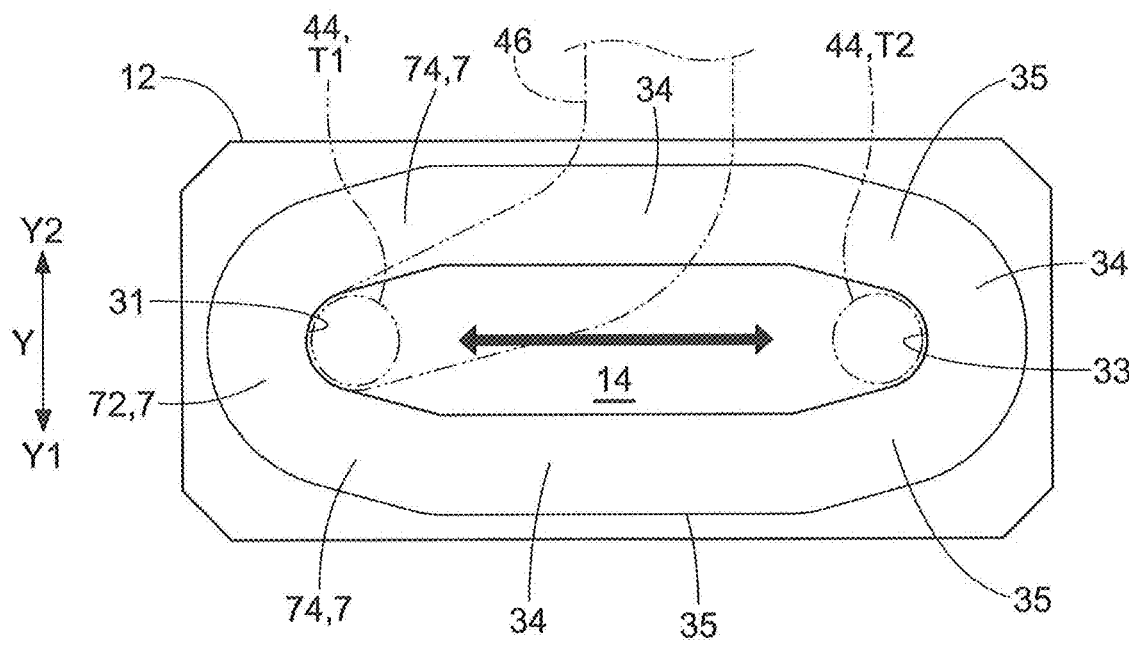
FIG. 7 is a plan view of the first engagement receiver and a first guide portion.
Figure 8:
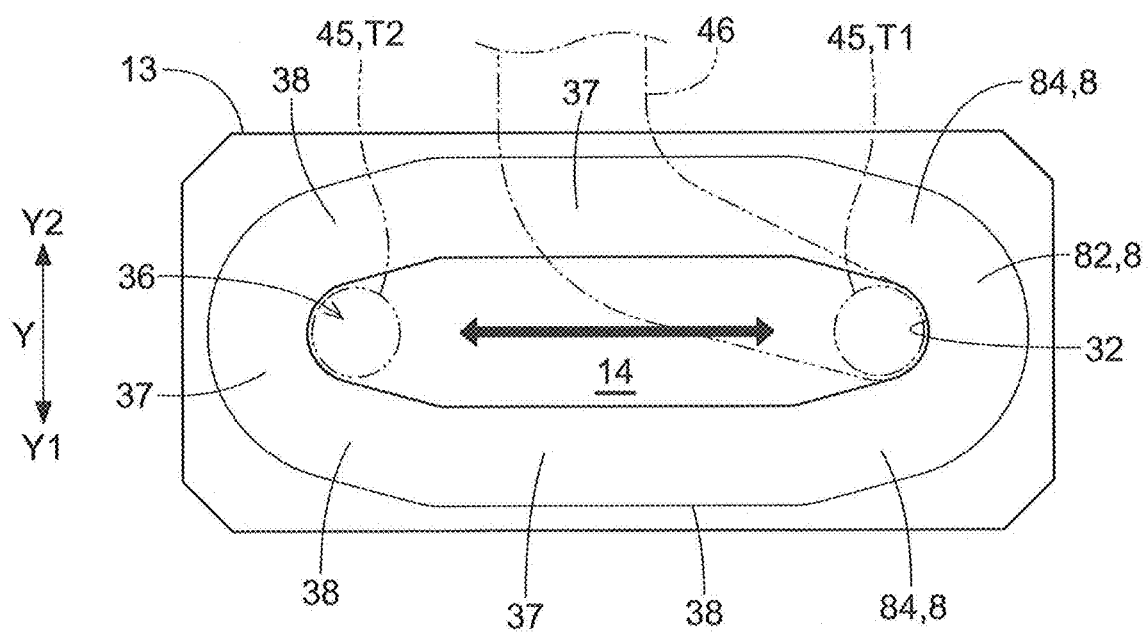
FIG. 8 is a plan view of a second engagement receiver and a second guide portion.

As shown in FIGS. 7 and 8, the operation of changing the posture of the pair of supports 40 from the releasing posture T2 to the holding posture T1 is referred to as a holding operation. At least one of the holder 4 or the container mount 3 includes a first guide portion 7 that guides the first engagement portion 44 moving in response to the holding operation of the first support 41 toward the first engagement receiver 31 and a second guide portion 8 that guides the second engagement portion 45 moving in response to the holding operation of the second support 42 toward the second engagement receiver 32. In the present embodiment, the container mount 3 includes the first guide portion 7 and the second guide portion 8. More specifically, the first guide portion 7 is in the first guide 12, and the second guide portion 8 is in the second guide 13.

The holder 4 also includes the first guide portion 7 and the second guide portion 8. More specifically, the first guide portion 7 is in the first engagement portion 44, and the second guide portion 8 is in the second engagement portion 45. In the present embodiment, in addition to guiding the first engagement portion 44 moving in response to the holding operation of the first support 41, the first guide portion 7 guides the first engagement portion 44 moving in response to a lowering operation of the holder 4. The first guide portion 7 in the container mount 3 guides the first engagement portion 44 in response to the holding operation. The first guide portion 7 in the container mount 3 and the first guide portion 7 in the holder 4 guide the engagement portion 44 in response to the lowering operation in cooperation with each other. In addition to guiding the second engagement portion 45 moving in response to the holding operation of the second support 42, the second guide portion 8 guides the second engagement portion 45 moving in response to the lowering operation of the holder 4. The second guide portion 8 in the container mount 3 guides the second engagement portion 45 in response to the holding operation. The second guide portion 8 in the container mount 3 and the second guide portion 8 in the holder 4 guide the second engagement portion 45 in response to the lowering operation in cooperation with each other.

Figure 9:
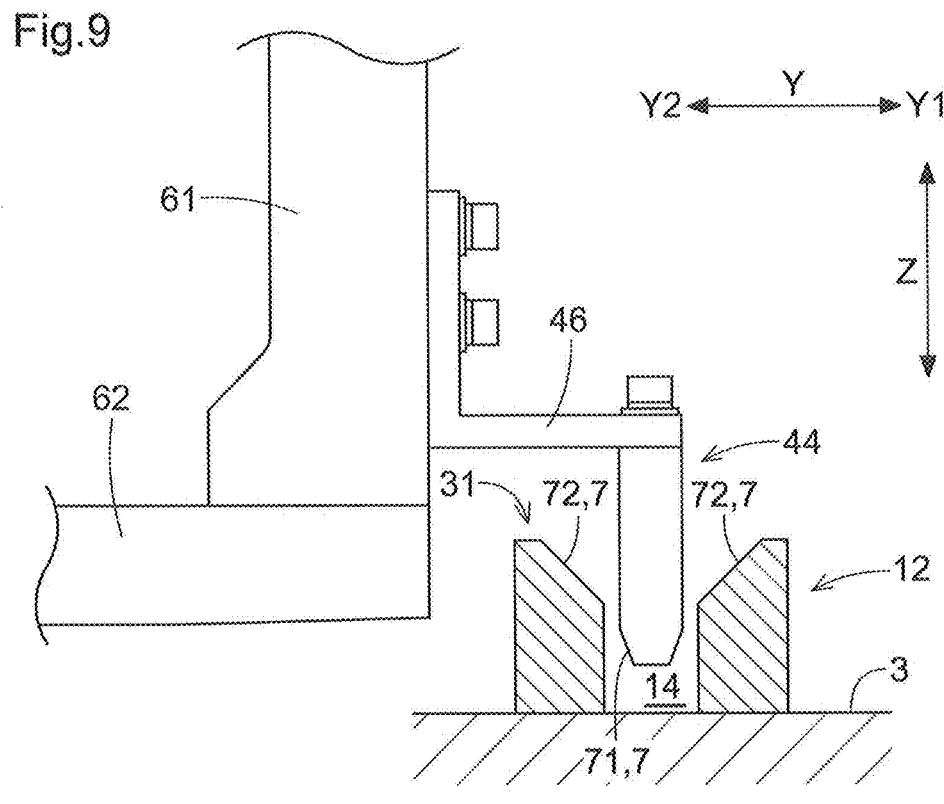
FIG. 9 is a front cross-sectional view of the first engagement receiver.

In the present embodiment, as shown in FIG. 9, the first guide portion 7 has at least one of a tapered guide surface (first engagement guide surface 71) and a flared guide surface (first engagement receiver guide surface 72). The first engagement guide surface 71 is on a lower portion of the first engagement portion 44 and has a smaller horizontal dimension downward. The first engagement receiver guide surface 72 is on an upper portion of the first engagement receiver 31 and has a larger horizontal dimension upward. The second guide portion 8 has at least one of a tapered guide surface (second engagement guide surface 81) and a flared guide surface (second engagement receiver guide surface 82). The second engagement guide surface 81 is on a lower portion of the second engagement portion 45 and has a smaller horizontal dimension downward. The second engagement receiver guide surface 82 is on an upper portion of the second engagement receiver 32 and has larger horizontal dimensions upward. In this example, the first guide portion 7 has both the first engagement guide surface 71 and the first engagement receiver guide surface 72. Similarly, the second guide portion 8 has both the second engagement guide surface 81 and the second engagement receiver guide surface 82. The first guide portion 7 and the second guide portion 8 have the same structure. Thus, the structure of the first guide portion 7 will be described in detail, and the structure of the second guide portion 8 will not be described. As described above, the first engagement guide surface 71 on the lower portion of the first engagement portion 44 is entirely tapered in the circumferential direction and has the smaller horizontal dimensions downward. In the illustrated example, the portion of the first engagement portion 44 having the first engagement guide surface 71 is in the form of a conical frustum as viewed in the horizontal direction. The first engagement receiver guide surface 72 is on the groove 14 including the first engagement receiver 31 in the first guide 12. In the example in FIG. 9, the groove 14 corresponding to the first engagement portion 44 is wider in the horizontal direction in its upper portion than in its lower portion as viewed in the first direction X, or more specifically, is Y-shaped. The first engagement receiver guide surface 72 is on an upper portion of the Y-shaped groove 14. In the examples in FIGS. 6 and 7, the first engagement receiver guide surface 72 is in the form of an arc corresponding to the shape of the first engagement receiver 31. In the example in FIGS. 7 and 8, the grooves 14 in the first guide 12 and the second guide 13 each have a Y-shaped section as viewed in the first direction X at any position in the first direction X.

In the present embodiment, as shown in FIG. 7, the first guide portion 7 has a pair of flared first guide surfaces 74 connected to the first engagement receiver 31 and wider in the second direction Y at a farther position on the releasing side X2 in the first direction. As shown in FIG. 8, the second guide portion 8 has a pair of flared second guide surfaces 84 connected to the second engagement receiver 32 and wider in the second direction Y at a farther position on the releasing side X2 in the first direction. As described above, the first guide portion 7 and the second guide portion 8 have the same structure. Thus, the structure of the second guide surface 84 will not be described in detail. In this example, the pair of first guide surfaces 74 are spaced from each other in the second direction Y with the groove 14 between them. In this example, the pair of first guide surfaces 74 are continuous with the first engagement receiver 31 and the first engagement receiver guide surface 72. In the example in FIG. 7, the pair of first guide surfaces 74 extend continuously from the opposite ends of the first engagement receiver 31 and the opposite ends of the first engagement receiver guide surface 72 in the second direction Y and from the end of the first engagement receiver 31 and the end of the first engagement receiver guide surface 72 on the releasing side X2 in the first direction toward the releasing side X2 in the first direction. In this example, the pair of first guide surfaces 74 are flared upward and wider in the second direction Y. The first guide surfaces 74 are thus slopes wider in the second direction Y at a farther position upward and on the releasing side X2 in the first direction.

In this example, as shown in FIG. 7, the first guide 12 further includes a first releasing-side positioner 33 and first releasing-side guide portions 35. As shown in FIG. 8, the second guide 13 further includes a second releasing-side positioner 36 and second releasing-side guide portions 38. The first releasing-side positioner 33, the first releasing-side guide portions 35, the second releasing-side positioner 36, and the second releasing-side guide portions 38 are on the corresponding groove 14. The first releasing-side positioner 33 and the second releasing-side positioner 36 have the same structure. The first releasing-side guide portions 35 and the second releasing-side guide portions 38 have the same structure. Thus, the structures of the second releasing-side positioner 36 and the second releasing-side guide portions 38 will not be described in detail. In the illustrated example, the first releasing-side positioner 33 is at the end of the groove 14 in the first guide 12 on the releasing side X2 in the first direction.

As described above, the groove 14 is simply open upward. Thus, when the first engagement portion 44 is placed at the end of the groove 14 on the releasing side X2 in the first direction, the first releasing-side positioner 33 restricts the first engagement portion 44 from moving further toward the releasing side X2 in the first direction beyond the first releasing-side positioner 33. Similarly, the second releasing-side positioner 36 restricts the second engagement portion 45 from moving further toward the releasing side X2 in the first direction beyond the second releasing-side positioner 36. The first releasing-side positioner 33 is, similarly to the first engagement receiver 31, in the form of an arc corresponding to the shape and the size of the first engagement portion 44. The first releasing-side guide portions 35 connect the pair of first guide surfaces 74 and the first releasing-side positioner 33 on the groove 14 in the first guide 12. In other words, a pair of the first releasing-side guide portions 35 are on the groove 14. The pair of first releasing-side guide portions 35 have tapered ends on the releasing side X2 in the first direction and wider in the second direction Y at a farther position on the holding side X1 in the first direction. The tapered ends guide the first engagement portion 44 moving from a position on the holding side X1 in the first direction to the first releasing-side positioner 33. The pair of first releasing-side guide portions 35 have portions extending in the first direction X on the holding side X1 in the first direction relative to the end on the releasing side X2 in the first direction. The first releasing-side positioner 33 and the first releasing-side guide portions 35 have, on their entire upper portions, a flared guide surface (first releasing-side guide surface 34) having a larger horizontal dimension upward. The first engagement receiver guide surface 72 may include the first releasing-side guide surface 34. As shown in FIG. 8, the second releasing-side positioner 36 and the second releasing-side guide portions 38 also have, on their entire upper portions, a flared guide surface (second releasing-side guide surface 37) having a larger horizontal dimension upward. The second engagement receiver guide surface 82 may include the second releasing-side guide surface 37.

Figure 10:
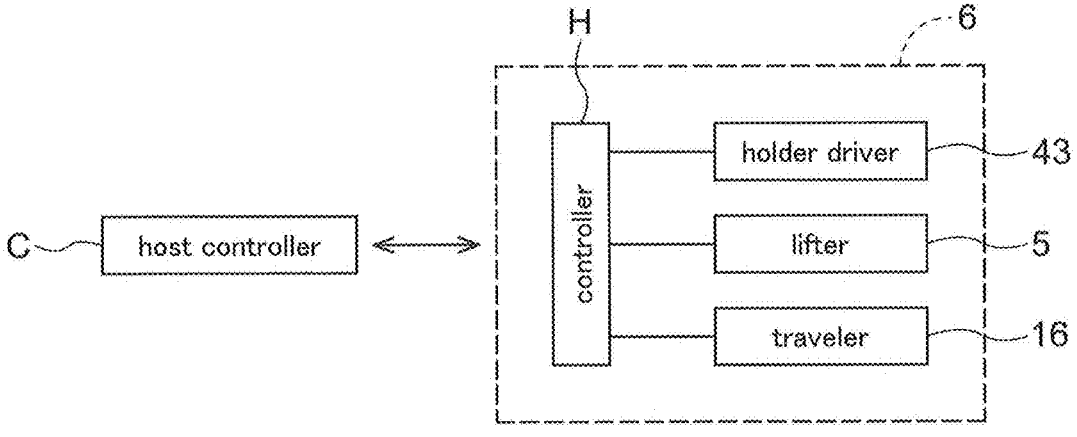
FIG. 10 is a control block diagram.

In the present embodiment, as shown in FIG. 10, the controller H controls the traveler 16, the lifter 5, and the holder driver 43. The controller H is connected to a host controller C that controls the entire transport facility 1 for mutual communication. The controller H controls the traveler 16, the lifter 5, and the holder driver 43 based on a command obtained from the host controller C. The controller H performs transport control for transporting a container 2 between multiple processing devices 9 and transfer control for transferring a container 2 to and from a container mount 3. In the transport control, the controller H controls the traveler 16 (travel motor M1) to direct the transport vehicle 6 to a processing device 9 as a transfer target based on a transport command from the host controller C. The controller H stops the transport vehicle 6 at a stop position (a position immediately above a mount body 29 of a container mount 3) corresponding to the container mount 3 in the processing device 9 as the transfer target.

The controller H then performs transfer control for the stopped transport vehicle 6. Control for transferring a container 2 mounted on the container mount 3 to the transport vehicle 6 will be described. The controller H controls the lifter 5 to lower the holder 4 toward the container mount 3, with the pair of supports 40 in the releasing posture T2. As shown in FIG. 6, the controller H lowers the holder 4 until the first support plate 62 and the second support plate 64 are lower than the bottom 25 (supportable portions 21) of the container 2 supported on the mount body 29. As the holder 4 lowers, the first engagement portion 44 of the first support 41 is received in the first releasing-side positioner 33 in the groove 14 on the first guide 12 (FIG. 6). Similarly, the second engagement portion 45 of the second support 42 is received in the second releasing-side positioner 36 in the groove 14 on the second guide 13. The controller H then controls the holder driver 43 to perform the holding operation. In other words, the controller H controls the holder driver 43 to cause the pair of supports 40 to change the posture from the releasing posture T2 to the holding posture T1. In response to the change in the posture of the pair of supports 40, the first engagement portion 44 and the second engagement portion 45 each move along a movement path in the corresponding groove 14 from a position on the releasing side X2 in the first direction to a position on the holding side X1 in the first direction. When the pair of supports 40 change the posture to the holding posture T1, the first engagement portion 44 engages with the first engagement receiver 31 in the first guide 12. More specifically, the first engagement portion 44 moves in the first direction X from the first releasing-side positioner 33 and comes in contact with the first engagement receiver 31, or the end of the groove 14 in the first guide 12 on the holding side X1 in the first direction (FIG. 6). Similarly, the second engagement portion 45 also moves in the first direction X from the second releasing-side positioner 36 and comes in contact with the second engagement receiver 32, or the end of the groove 14 in the second guide 13 on the holding side X1 in the first direction. The controller H then controls the lifter 5 to lift the holder 4. Thus, the pair of supports 40 rise and support the supportable portions 21 of the container 2. In the present embodiment, as shown in FIG. 6, in response to the lifter 5 lifting the first support 41 and the second support 42 in the holding posture T1 after the holding operation at positions below the supportable portions 21 of the container 2, the third engagement portion 48 engages with the third engagement receiver 23 and the fourth engagement portion 49 engages with the fourth engagement receiver 24. More specifically, the third engagement portion 48 on the first support plate 62 engages with the third engagement receiver 23 in the first supportable portion 21a of the container 2. Similarly, the fourth engagement portion 49 on the second support plate 64 engages with the fourth engagement receiver 24 in the second supportable portion 21b of the container 2. The pair of supports 40 thus support the container 2. The controller H controls the lifter 5 and lifts the holder 4 continuously. The container 2 is then lifted from the container mount 3 (the mount body 29 in this example) and moves from the lowered position V2 (FIG. 1) to the accommodated position V1 (FIG. 2).

When the container 2 supported on the container mount 3 rises to the accommodated position V1, the controller H causes the transport vehicle 6 to travel based on the next transport command.

Figure 11:
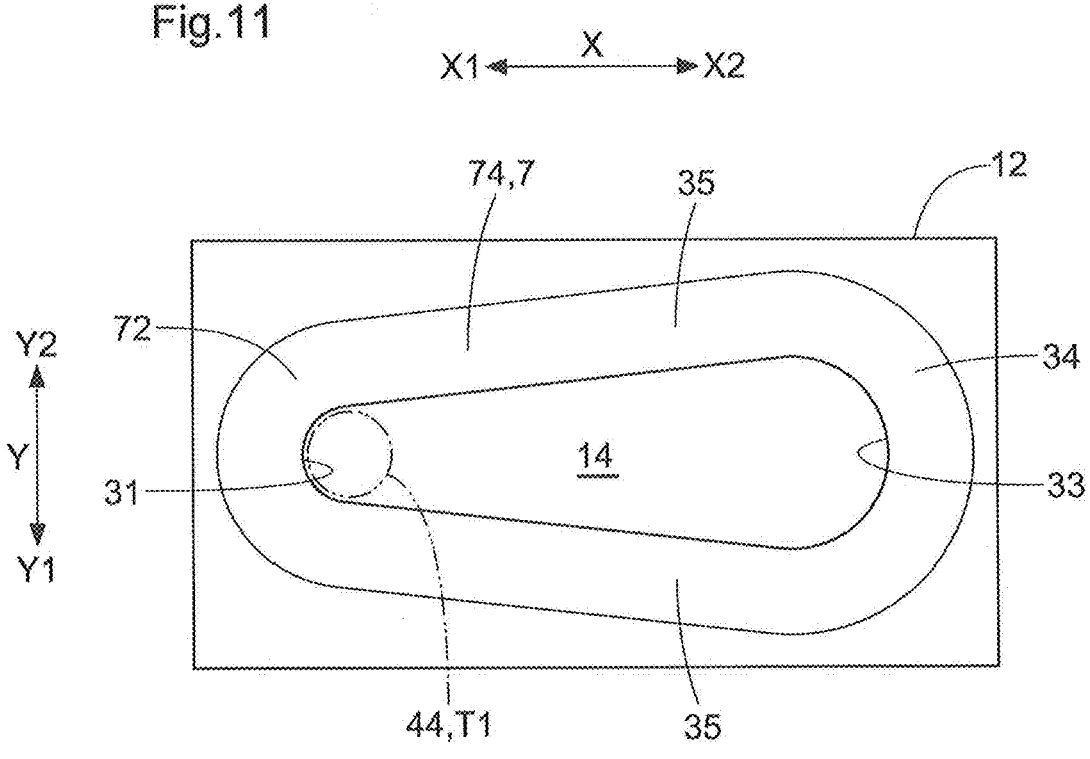
FIG. 11 is a plan view of a first engagement receiver and a first guide portion in another embodiment.
Figure 12:
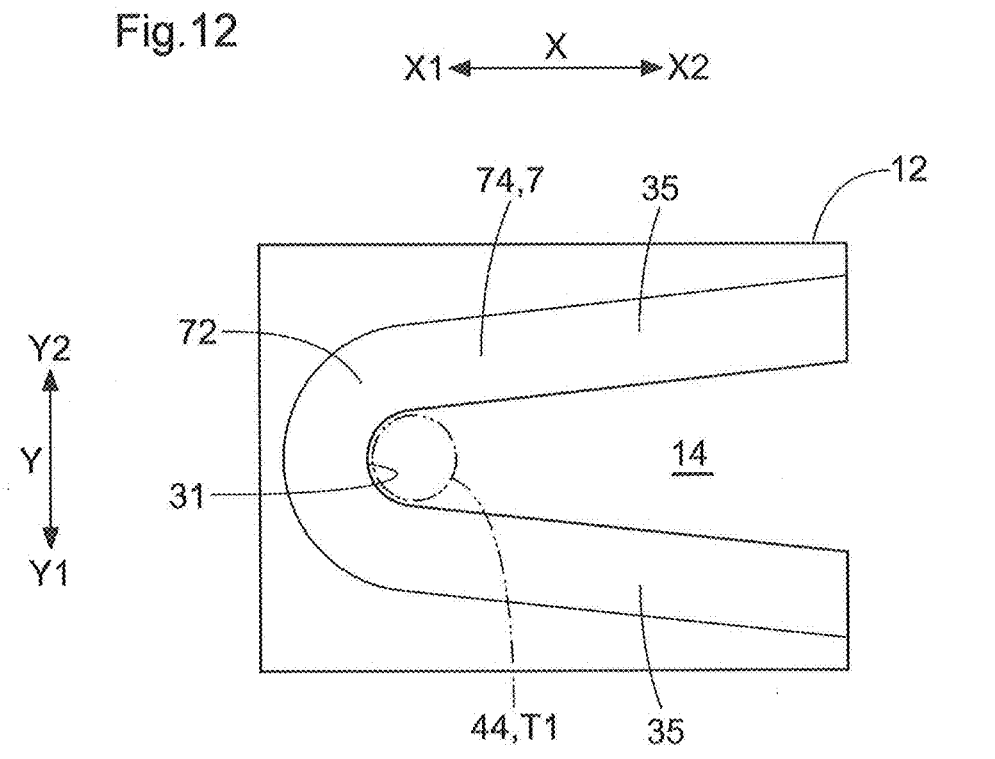
FIG. 12 is a plan view of a first engagement receiver and a first guide portion in another embodiment.

Other Embodiments (1) In the above embodiment, the first guide 12 further includes the first releasing-side positioner 33 and the first releasing-side guide portions 35, with the first releasing-side positioner 33 in the form of an arc corresponding to the shape and the size of the first engagement portion 44 in the groove 14. The second guide 13 further includes the second releasing-side positioner 36 and the second releasing-side guide portions 38, with the second releasing-side positioner 36 in the form of an arc corresponding to the shape and the size of the second engagement portion 45 in the groove 14. The first releasing-side positioner 33 and the second releasing-side positioner 36 may have different shapes and sizes as appropriate. Such an example is shown in FIG. 11. In FIG. 11, the first releasing-side positioner 33 is in the form of an arc corresponding to the shape of the first engagement portion 44 but is larger than the first engagement portion 44 in the second direction Y. Thus, the entire portion of the first releasing-side guide portions 35 in the first direction X is tapered to be narrower in the second direction Y at a farther position on the holding side X1 in the first direction. As in the example in FIG. 12, the groove 14 in the first guide 12 may be open on the releasing side X2 in the first direction, in addition to being open upward. Thus, the first guide 12 may have no first releasing-side guide portion 35. The second guide 13 may have the same structure as the first guide 12.

Figure 13:
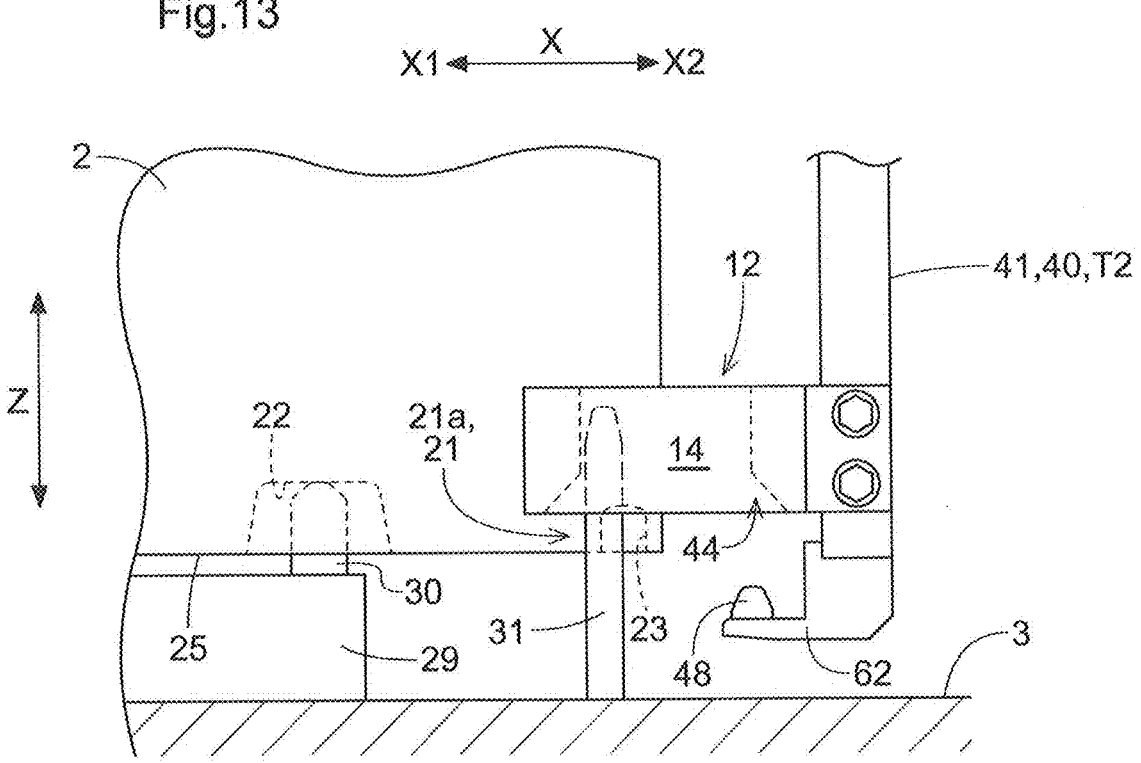
FIG. 13 is an enlarged view of a transportation facility according to another embodiment showing main components.

(2) In the above embodiment, each of the first engagement portion 44 and the second engagement portion 45 is in the form of a protrusion protruding downward. Each of the first engagement receiver 31 and the second engagement receiver 32 is in the form of a recess being open upward. This is not limitative. Each of the first engagement portion 44 and the second engagement portion 45 may be in the form of a recess being open downward. Each of the first engagement receiver 31 and the second engagement receiver 32 may be in the form of a protrusion protruding upward. FIG. 13 shows such an example. In FIG. 13, the first guide 12 is disposed on the first support 41. The groove 14 in the first guide 12 is open downward. When the pair of supports 40 are in the releasing posture T2, the first engagement receiver 31 in the form of a protrusion engages with the end of the groove 14 on the holding side X1 in the first direction. In response to the pair of supports 40 changing the posture from the releasing posture T2 to the holding posture T1, the first guide 12 moves from a position on the releasing side X2 in the first direction to a position on the holding side X1 in the first direction. When the pair of supports 40 enter the holding posture T1, the first engagement receiver 31 in the form of a protrusion engages with the first engagement portion 44 at the end of the groove 14 on the releasing side X2 in the first direction. In this manner, different mechanisms may be used as appropriate to engage the first engagement portion 44 with the first engagement receiver 31 and to engage the second engagement portion 45 with the second engagement receiver 32.

(3) In the above embodiment, both the holder 4 and the container mount 3 include the first guide portion 7 and the second guide portion 8, with both the first engagement portion 44 and the first engagement receiver 31 including the first guide portion 7 and both the second engagement portion 45 and the second engagement receiver 32 including the second guide portion 8. This is not limitative. The container mount 3 alone may include the first guide portion 7 and the second guide portion 8. For example, the first engagement receiver 31 may have the first engagement receiver guide surface 72 as the first guide portion 7, and the second engagement receiver 32 may have the second engagement receiver guide surface 82 as the second guide portion 8, with the first engagement portion 44 having no first engagement guide surface 71 and the second engagement portion 45 having no second engagement guide surface 81. In this case, the first engagement portion 44 and the second engagement portion 45 may each include a lower portion in the form of a pillar (e.g., a column or a prism).

(4) In the above embodiment, the first engagement portion 44 and the second engagement portion 45 are arranged inward in the first direction X from the outer edges of the pair of supports 40 in the first direction X. This is not limitative. For example, the first engagement portion 44 and the second engagement portion 45 may be arranged outward in the first direction X from the outer edges of the pair of supports 40 in the first direction X. Either the first engagement portion 44 or the second engagement portion 45 alone may be disposed inward in the first direction X from the outer edges of the pair of supports 40 in the first direction X. In this manner, the first engagement portion 44 and the second engagement portion 45 may be arranged differently as appropriate.

(5) In the above embodiment, the first guide portion 7 has the pair of flared first guide surfaces 74 connected to the first engagement receiver 31 and wider in the second direction Y at a farther position on the releasing side X2 in the first direction. The second guide portion 8 has the pair of flared second guide surfaces 84 connected to the second engagement receiver 32 and wider in the second direction Y at a farther position on the releasing side X2 in the first direction. This is not limitative. The first guide portion 7 may not have the pair of first guide surfaces 74, and the second guide portion 8 may not have the pair of second guide surfaces 84. The pair of first guide surfaces 74 may extend in the first direction X and may be parallel to each other, and the pair of second guide surfaces 84 may extend in the first direction X and may be parallel to each other. In this manner, the first guide surfaces 74 and the second guide surfaces 84 may not be flared.

(6) In the above embodiment, the first support 41 includes the third engagement portion 48 engageable with the third engagement receiver 23 in the supportable portion 21 of the container 2, and the second support 42 includes the fourth engagement portion 49 engageable with the fourth engagement receiver 24 in the supportable portion 21 of the container 2. This is not limitative. The first support 41 may include no third engagement portion 48, and the second support 42 may include no fourth engagement portion 49. Although the first support 41 includes the single third engagement portion 48 and the second support 42 includes the single fourth engagement portion 49 in this example, the first support 41 may include multiple third engagement portions 48 and the second support 42 may include multiple fourth engagement portions 49. Although the third engagement portion 48 is disposed on the first support plate 62 and the fourth engagement portion 49 is disposed on the second support plate 64 in this example, the third engagement portion 48 may be disposed on the first arm 61 and the fourth engagement portion 49 may be disposed on the second arm 63. In this case, the third engagement receiver 23 and the fourth engagement receiver 24 in the container 2 may be disposed at different positions as appropriate based on the positions of the third engagement portion 48 and the fourth engagement portion 49.

(7) The structure described in each of the above embodiments may be combined with any other structures described in the other embodiments unless any contradiction arises. This also applies to combinations of the embodiments described as other embodiments. For other structures as well, the embodiments described herein are merely illustrative in all aspects and may be modified variously as appropriate without departing from the spirit and scope of the disclosure.

Overview of Embodiments

An overview of the transport facility described above is provided below.

A transport facility according to an aspect of the disclosure includes a container mount that supports a container, and a transport vehicle that transports the container. The transport vehicle includes a holder that holds and releases the container, and a lifter that lifts and lowers the holder. The holder includes a first support and a second support being a pair of supports that support a supportable portion of the container, a holder driver that moves the pair of supports toward and away from each other to change a posture of the pair of supports between a holding posture for holding the container and a releasing posture for releasing the container, a first engagement portion fixed to the first support, and a second engagement portion fixed to the second support. The container mount includes a container positioner that positions the container, a first engagement receiver at a fixed position relative to the container positioner, and a second engagement receiver at a fixed position relative to the container positioner. The first engagement receiver is engageable with the first engagement portion to position the first engagement portion. The second engagement receiver is engageable with the second engagement portion to position the second engagement portion. At least one of the holder or the container mount includes a first guide portion and a second guide portion. The first guide portion guides the first engagement portion moving in response to a holding operation of the first support toward the first engagement receiver.

The second guide portion guides the second engagement portion moving in response to the holding operation of the second support toward the second engagement receiver. The holding operation is an operation of the pair of supports to change the posture from the releasing posture to the holding posture.

In this structure, with the movement of the first engagement portion and the second engagement portion in response to the holding operation of the first support and the second support included in the holder, the first guide portion can guide the first engagement portion toward the first engagement receiver until the first engagement portion engages with the first engagement receiver, and the second guide portion can guide the second engagement portion toward the second engagement receiver until the second engagement portion engages with the second engagement receiver. This can position the first engagement portion and the second engagement portion appropriately, thus positioning the first support to which the first engagement portion is fixed and the second support to which the second engagement portion is fixed appropriately relative to the container positioned by the container positioner. Thus, the pair of supports can easily support the container appropriately. The lifter can lift and lower the holder that is holding the container appropriately. In this manner, this structure can transfer the container between the container mount and the transport vehicle appropriately.

Each of the first engagement portion and the second engagement portion may be in a form of a protrusion protruding downward. Each of the first engagement receiver and the second engagement receiver may be in a form of a recess being open upward.

With this structure, the first engagement portion fixed to the first support engages with the first engagement receiver in the container mount from above. The second engagement portion fixed to the second support engages with the second engagement receiver in the container mount from above. Thus, the first engagement portion and the second engagement portion can be positioned appropriately with a relatively simple structure. With the first engagement portion and the second engagement portion each in the form of a protrusion, the holder can easily be smaller and lighter than a holder with the first engagement portion and the second engagement portion each in the form of a recess.

The first guide portion may have at least one of a tapered guide surface on a lower portion of the first engagement portion or a flared guide surface on an upper portion of the first engagement receiver. The tapered guide surface may have a smaller horizontal dimension downward. The flared guide surface may have a larger horizontal dimension upward. The second guide portion may have at least one of a tapered guide surface on a lower portion of the second engagement portion or a flared guide surface on an upper portion of the second engagement receiver. The tapered guide surface may have a smaller horizontal dimension downward. The flared guide surface may have a larger horizontal dimension upward.

With this structure, the first guide portion and the second guide portion can guide the first engagement portion and the second engagement portion toward appropriate positions while the holder is being lowered to hold or release a container. This can position the first support to which the first engagement portion is fixed and the second support to which the second engagement portion is fixed appropriately relative to the container positioner. Thus, the holder can easily and appropriately perform operations to hold and release the container.

The first engagement portion and the second engagement portion may be arranged inward in a first direction from outer edges of the pair of supports in the first direction in which the pair of supports move toward and away from each other.

With this structure, the holder can easily be smaller in the first direction. Thus, the container supported on the container mount is easily held and released without being obstructed by any object around the container mount.

The container mount may include the first guide portion and the second guide portion. The first engagement receiver and the second engagement receiver may be open on a releasing side in a first direction in which the pair of supports move toward and away from each other. The releasing side in the first direction may be a side on which the first support in the releasing posture is disposed relative to the first support in the holding posture and may be a side on which the second support in the releasing posture is disposed relative to the second support in the holding posture. The first guide portion may have a pair of flared first guide surfaces connected to the first engagement receiver and wider in a second direction at a farther position on the releasing side in the first direction. The second direction may be perpendicular to the first direction when viewed in a vertical direction. The second guide portion may have a pair of flared second guide surfaces connected to the second engagement receiver and wider in the second direction at a farther position on the releasing side in the first direction.

With this structure, using the movement of the first engagement portion and the second engagement portion in the first direction in response to the holding operation of the first support and the second support included in the holder, the first guide portion can easily guide the first engagement portion toward the first engagement receiver until the first engagement portion engages with the first engagement receiver, and the second guide portion can guide the second engagement portion toward the second engagement receiver until the second engagement portion engages with the second engagement receiver.

The first support may include a third engagement portion engageable with a third engagement receiver in the supportable portion of the container. The second support may include a fourth engagement portion engageable with a fourth engagement receiver in the supportable portion of the container. In response to the lifter lifting the first support and the second support in the holding posture at a position below the supportable portion of the container after the holding operation, the third engagement portion may engage with the third engagement receiver and the fourth engagement portion may engage with the fourth engagement receiver.

With this structure, the pair of supports are appropriately supported relative to the container positioned by the container positioner. Thus, the third engagement portion can easily engage with the third engagement receiver, and the fourth engagement portion can easily engage with the fourth engagement receiver. With the third engagement portion engaging with the third engagement receiver and the fourth engagement portion engaging with the fourth engagement receiver, the container can be lifted relative to the container mount while being held in an appropriate posture.

The transport facility according to one or more embodiments of the disclosure produces at least one of the effects described above.

What is claimed is:

1. A transport facility, comprising:
a container mount configured to support a container; and a transport vehicle configured to transport the container, the transport vehicle comprising:
a holder configured to hold and release the container, and
a lifter configured to lift and lower the holder, and
wherein:
the holder comprises:
a first support and a second support comprising a pair of supports configured to support a supportable portion of the container,
a holder driver configured to move the pair of supports toward and away from each other to change a posture of the pair of supports between a holding posture for holding the container and a releasing posture for releasing the container,
a first engagement portion fixed to the first support, and
a second engagement portion fixed to the second support,
the container mount comprises:
a container positioner configured to position the container,
a first engagement receiver at a fixed position relative to the container positioner, the first engagement receiver engageable with the first engagement portion to position the first engagement portion, and
a second engagement receiver at a fixed position relative to the container positioner, the second engagement receiver engageable with the second engagement portion to position the second engagement portion,
at least one of the holder or the container mount comprises a first guide portion and a second guide portion, the first guide portion configured to guide the first engagement portion moving in response to a holding operation of the first support toward the first engagement receiver, the second guide portion configured to guide the second engagement portion moving in response to the holding operation of the second support toward the second engagement receiver, the holding operation comprising an operation of the pair of supports to change the posture from the releasing posture to the holding posture.

2. The transport facility according to claim 1, wherein:
each of the first engagement portion and the second engagement portion is in a form of a protrusion protruding downward, and
each of the first engagement receiver and the second engagement receiver is in a form of a recess that is open upward.

3. The transport facility according to claim 2, wherein:
the first guide portion has at least one of a tapered guide surface on a lower portion of the first engagement portion or a flared guide surface on an upper portion of the first engagement receiver, the tapered guide surface has a smaller horizontal dimension downward, and the flared guide surface has a larger horizontal dimension upward, and
the second guide portion has at least one of a tapered guide surface on a lower portion of the second engagement portion or a flared guide surface on an upper portion of the second engagement receiver, the tapered guide surface has a smaller horizontal dimension downward, and the flared guide surface has a larger horizontal dimension upward.

4. The transport facility according to claim 3, wherein:
the first engagement portion and the second engagement portion are arranged inward in a first direction from outer edges of the pair of supports in the first direction in which the pair of supports move toward and away from each other.

5. The transport facility according to claim 2, wherein:

the container mount comprises the first guide portion and the second guide portion, the first engagement receiver and the second engagement receiver are open on a releasing side in a first direction in which the pair of supports move toward and away from each other, the releasing side in the first direction is a side on which the first support in the releasing posture is disposed relative to the first support in the holding posture and is a side on which the second support in the releasing posture is disposed relative to the second support in the holding posture, the first guide portion has a pair of flared first guide surfaces connected to the first engagement receiver and wider in a second direction at a farther position on the releasing side in the first direction, and the second direction is perpendicular to the first direction when viewed in a vertical direction, and the second guide portion has a pair of flared second guide surfaces connected to the second engagement receiver and wider in the second direction at a farther position on the releasing side in the first direction.

6. The transport facility according to claim 1, wherein:

the first support comprises a third engagement portion engageable with a third engagement receiver in the supportable portion of the container, the second support comprises a fourth engagement portion engageable with a fourth engagement receiver in the supportable portion of the container, and in response to the lifter lifting the first support and the second support in the holding posture at a position below the supportable portion of the container after the holding operation, the third engagement portion engages with the third engagement receiver and the fourth engagement portion engages with the fourth engagement receiver.

\* \* \* \* \*